United States Patent
Matsuyama

(10) Patent No.: US 6,724,068 B2
(45) Date of Patent: Apr. 20, 2004

(54) OPTICAL SEMICONDUCTOR DEVICE AND FABRICATING METHOD THEREOF

(75) Inventor: Takayuki Matsuyama, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/104,634

(22) Filed: Mar. 21, 2002

(65) Prior Publication Data

US 2002/0139989 A1 Oct. 3, 2002

(30) Foreign Application Priority Data

Mar. 29, 2001 (JP) .................................. P2001-097598
Mar. 15, 2002 (JP) .................................. P2002-072979

(51) Int. Cl.[7] .............................................. H01L 29/06
(52) U.S. Cl. .................. 257/618; 257/622; 257/623; 257/95; 257/101; 372/45; 372/49; 372/50
(58) Field of Search ................ 257/622, 623, 257/618, 95, 101, 103; 372/44, 45, 46, 49, 50

(56) References Cited

U.S. PATENT DOCUMENTS 5,360,763 A  * 11/1994  Nakamura .................. 438/44
5,470,786 A  * 11/1995  Irikawa et al. ............... 438/31
5,918,109 A  *  6/1999  Koui ............................ 438/31
6,134,368 A  * 10/2000  Sakata ....................... 385/131
6,204,078 B1 *  3/2001  Inomoto ...................... 438/22
6,323,507 B1 * 11/2001  Yokoyama et al. ........... 257/79

FOREIGN PATENT DOCUMENTS

JP          11-204879         7/1999

* cited by examiner

Primary Examiner—Nathan J. Flynn
Assistant Examiner—Pershelle Greene
(74) Attorney, Agent, or Firm—Hogan & Hartson, LLP

(57) ABSTRACT

An optical semiconductor device having a low threshold current and easiness of a single transverse mode oscillation is provided. The optical semiconductor device has a low device parasitic capacitance that allows a direct modulation at high speed.

The optical semiconductor device comprises a first conduction type substrate, a stripe shaped active layer formed on the first conduction type substrate, a mesa shaped burying layer formed around the active layer and having a larger band gap than that of the active layer, and a groove that electrically isolates the burying layer, wherein the section of the burying layer is in an inverse trapezoid shape of which the upper base side is longer than the lower base side.

11 Claims, 12 Drawing Sheets

OPTICAL SEMICONDUCTOR DEVICE AND FABRICATING METHOD THEREOF

CROSS REFERENCE TO RELATED APPLICATIONS

This application is based upon and claims the benefits of priorities from prior Japanese Patent Application No. 2001-97598 filed on Mar. 29, 2001, and prior Japanese Patent Application No. 2002-072979 filed on Mar. 15, 2002, which claims priority of Japanese Patent Application No. 2001-97598; the entire contents of which are incorporated herein by references.

BACKGROUND OF THE INVENTION

1. Field of the Invention

The present invention relates to an optical semiconductor device and a fabricating method thereof, in particular, to an optical semiconductor device that has a low device capacitance that allows the device to modulate directly at a high frequency of 10 Gb/s or higher and a fabricating method thereof.

2. Description of the Related Art

As demand of information communication increases, technologies that allow much information to be transmitted at low cost are required for not only a trunk line, but a branch line. Particularly, in recent years, as the Internet is becoming common, technologies allowing digital contents of audio data and video data of large capacities to be transmitted to end users at high speed and at low cost are demanded.

For example, it is predicted that optical communications will be performed in not only LAN systems of companies, but terminal units of home servers. In near future, it is expected that the market of optical communication systems used in short distance and provided at low cost will grow at an explosive pace. Thus, needs for a light source that allows such system to directly perform a modulating operation at high speed and at low cost are becoming strong.

Conventionally, a system that directly modulates a semiconductor laser is used in a short-distance low-cost communication. To directly modulate a semiconductor laser, it is preferred to decrease the parasitic capacitance and series resistance of a device.

In addition, characteristics of a semiconductor laser are largely varied with temperature. To stably operate a system, the temperature of the semiconductor laser is controlled in a constant level by a Peltier cooler. However, a more inexpensive system requires a semiconductor laser that does not need a temperature control and does not have a Peltier cooler.

To operate a semiconductor laser without cooling it, a lower threshold current, a structure free of a leak current, and an improved light emission efficiency are desired. To do that, a semiconductor laser having a buried hetero structure (a buried hetero semiconductor laser) is used.

FIG. 16 is a sectional view showing an example of the structure of a existing buried hetero semiconductor laser. Referring to FIG. 16, an n-type InP buffer layer 52 and an InGaAsP-MQW (a multiple quantum well) active layer 53 are successively grown over an n-type InP substrate 51. The InGaAsP-MQW active layer 53 is formed in a stripe whose width is 1.5 μm and that has a trapezoidal section. The InGaAsP-MQW active layer 53 is surrounded by a p-type InP burying layer 54 and an n-type InP burying layer 55. The active layer 53 is buried in these burying layers.

A p-type InP cladding layer 56 and a p-type InGaAs contact layer 57 are successively formed on the n-type InP burying layer 55. In addition, to electrically isolate the burying layers, grooves 58 are formed on both sides of the active layer 53. A SiO$_2$ film 59 is formed in the groove 58. The distance between two grooves 58 formed on both the sides of the active layer 53 is 10 μm.

A p-side electrode 60 and a bonding pad 61 are successively formed on the p-type InGaAs contact layer 57. An n-side electrode 62 is formed on the rear surface of the n-type InP substrate 51.

In such a semiconductor laser, since p-n inverse junctions of an n-type InP layer and a p-type InP layer are formed on both sides of the active layer 53. Thus, a leak current does not flow. A current injected from the p-side electrode 60 flows in only the InGaAsP-MQW active layer 53. When a plus voltage is applied to the p-side electrode 60, a bias voltage is also applied to a p-n junction of the burying layers. As a result, a depletion layer takes place at the interface of the n-type InP layer 55 and the p-type InP layer 54. The depletion layer that takes place in the burying layer becomes an electrical capacitor.

In such a buried hetero semiconductor laser, a current injected to an electrode effectively flows in only the active layer. Thus, the buried hetero semiconductor laser has the advantage of having a low threshold current.

As another type of a semiconductor laser, a ridge waveguide semiconductor laser is also known. In the ridge waveguide semiconductor laser, a ridge stripe shaped cladding layer is formed on an active layer. A current injected and supplied from an electrode is guided to the ridge portion so as to confine the current. In the ridge portion that is a current confinement layer, the width of the ridge stripe adjacent to the active layer is for example 2.5 μm.

The ridge waveguide semiconductor laser has an advantage of no parasitic capacitance of a depletion layer because of no layers unlike with the forgoing buried hetero semiconductor laser. However, the ridge waveguide semiconductor laser has a disadvantage of which a current tends to flow in a peripheral portion of an active layer adjacent to a ridge stripe, and a threshold current is higher.

As described above, in the buried hetero semiconductor laser shown in FIG. 16, a low oscillation threshold current can be easily accomplished. However, to perform a high-speed modulation, it is necessary to decrease the parasitic capacitance. To obtain a response of 10 GHz or higher, the parasitic capacitance should be 3 pF or lower.

FIG. 17 shows the relation between the width of the p-n junction portion of burying layers (hereinafter referred to as a mesa width) and the parasitic capacitance thereof. As denoted by a solid line in FIG. 17, to decrease the parasitic capacitance to 3 pF or lower, it is necessary to decrease the mesa width of the burying layers to 4.8 μm or lower.

FIG. 18 shows a buried hetero semiconductor laser with a narrowed mesa width. In the structure, when the mesa width that is the width of the p-n junction portion of the burying layer is 4.8 μm, the width of a mesa top portion MT is 3 μm. It was very difficult to form a p-side electrode and so forth on the narrow mesa top portion MT.

Even if such an electrode is formed, the width of the electrode will become as large as around 1 μm. Thus, the series resistance of the wiring portion will become large. As a result, the time constant (proportional to the product of capacitance and series resistance) cannot be reduced.

Moreover, in the buried hetero semiconductor device shown in FIG. 16, when the carrier concentration of the n-type InP burying layer 55 is lowered, the width of the depletion layer that takes place with a bias voltage applied to the p-n junction can be increased. The parasitic capacitance can be reduced without the narrowed mesa width.

A broken line shown in FIG. 17 represents the relation between the parasitic capacitance and the mesa width in the case that the carrier concentration of the n-type InP burying layer 55 is $1 \times 10^{17}$ cm$^{-3}$. As is clear from the diagram, when the carrier concentration is $1 \times 10^{17}$ cm$^{-3}$, even if the mesa width is 10 μm, the parasitic capacitance of the junction portion is 3 pF or lower.

However, in such a structure, the leak current increases and thereby the oscillation threshold current increases. For example, when the carrier concentration is $1 \times 10^{18}$ cm$^{-3}$, the threshold current is 6 mA. In contrast, when the carrier concentration is $1 \times 10^{17}$ cm$^{-3}$, the threshold current becomes 9 mA. In other words, the threshold current adversely increases by 50%.

Additionally, since the ridge waveguide semiconductor laser does not have burying layers, the device parasitic capacitance may become around 1 pF. However, since the optimum width of the active layer for the fundamental transverse mode oscillation is as large as around 2.5 μm, the oscillation threshold current becomes high (for example, around 11 mA). Further, since the active layer of the ridge waveguide semiconductor laser is a little wider than that of the buried hetero semiconductor laser, after the oscillation is started, the carrier density becomes slightly low. Thus, it is relatively difficult to increase the relaxation oscillation frequency.

An object of the present invention is to provide an optical semiconductor device that features a low threshold current and easiness of a single transverse mode oscillation and that has a low parasitic capacitance that allows a direct modulation at high speed; and a fabricating method thereof.

SUMMARY OF THE INVENTION

An optical semiconductor device according to an embodiment of the present invention comprises a first conduction type substrate, an active layer formed in a stripe on the first conduction type substrate, a mesa shaped burying layer formed around the active layer and having a larger band gap than that of the active layer, and a groove that electrically isolates the burying layer, wherein the section of the burying layer is in an inverse trapezoid shape of which the upper base side is longer than the lower base side.

An optical semiconductor device according to another embodiment of the present invention comprises a first conduction type substrate, an active layer formed on the first conduction type substrate, a current confinement layer formed in a ridge stripe on the active layer, a groove that electrically isolates the current confinement layer, the groove having a space portion, and a floating wiring portion formed over the groove.

An optical semiconductor device according to another embodiment of the present invention comprises a first conduction type substrate, an active layer formed on the first conduction type substrate, and a mesa shaped current confinement layer formed on the active layer, wherein a floating wiring portion is formed around the current confinement layer.

A method for fabricating an optical semiconductor device according to another embodiment of the present invention comprises preparing a first conduction type substrate, forming an active layer in a stripe on the first conduction type substrate, forming a burying layer around the active layer, the burying layer having a band gap larger than that of the active layer, forming grooves that isolate the burying layer in a stripe so as to form the section of the burying layer in an inverse trapezoid shape of which the upper base side is longer than the lower base side, forming a resin layer filled in the groove, forming wiring on the resin layer, and selectively etching the resin layer so as to remove all or part of the resin layer and form a space portion in the groove below the wiring.

A method for fabricating an optical semiconductor device according to another embodiment of the present invention comprises preparing a first conduction type substrate, forming an active layer on the first conduction type substrate, forming a current confinement layer on the active layer, forming a resin layer filled around the current confinement layer, forming wiring on the resin layer, and selectively etching the resin layer so as to remove all or part of the resin layer and form a space portion below the wiring.

These and other objects, features and advantages of the present invention will become more apparent in light of the following detailed description of embodiments thereof, as illustrated in the accompanying drawings.

BRIEF DESCRIPTION OF THE DRAWINGS

The invention is described with reference to the drawings, which are presented for the purpose of illustration only and limit in no way the invention.

Figure 1:
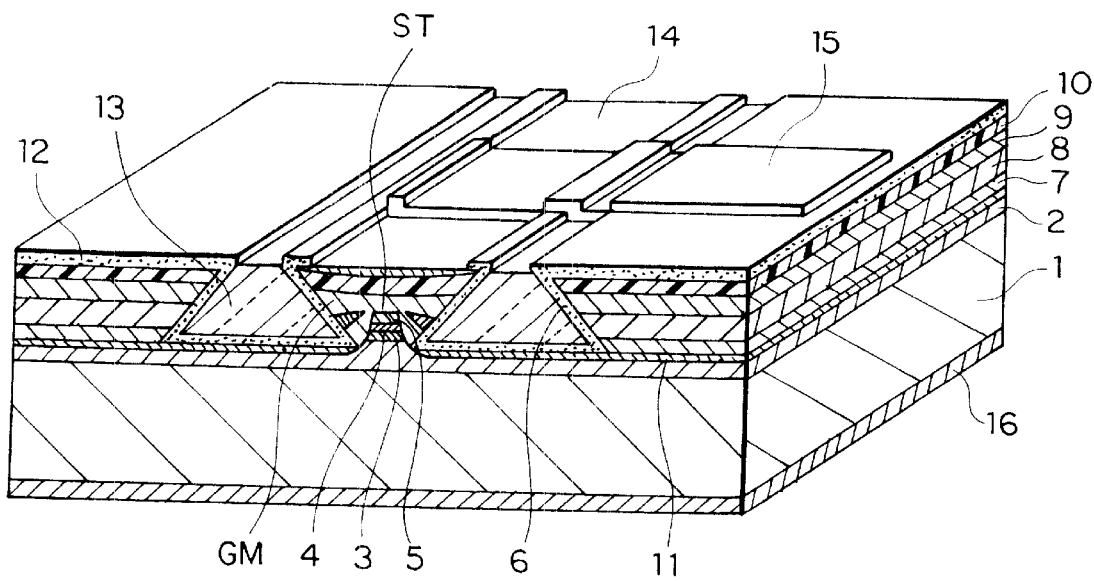
FIG. 1 is a perspective view showing a configuration of a semiconductor laser according to a first embodiment of the present invention.

DETAILED DESCRIPTION OF THE INVENTION (Explanation of Embodiments)

According to the present invention, a low device capacitance can be easily accomplished. Thus, an optical semiconductor device that can modulate a signal having a high frequency of 10 Gb/s or more can be accomplished.

In other words, according to an embodiment of the present invention, since the sectional shape of burying layer is an inverse trapezoid of which the upper base side is longer than the lower base side, the width and area of the p-n junction portion of the burying layer can be reduced. As a result, a low device capacitance can be accomplished. Thus, in addition to a low threshold current and easiness of a single transverse mode oscillation as features of the buried hetero structure, the device parasitic capacitance can be reduced.

As an implementation mode, the burying layer has a laminated structure of a first conduction type semiconductor layer and a second conduction type semiconductor layer. In addition, the carrier concentrations of the first conduction type semiconductor layer and the second conduction type semiconductor layer are larger than $1 \times 10^{17}$ cm$^{-3}$.

When the burying layer has a laminated structure of the first conduction type semiconductor layer and the semiconductor laser and the carrier concentrations thereof are larger than $1 \times 10^{17}$ cm$^{-3}$, the leak current can be reduced.

Further, as an implementation mode, the lowest layer of the burying layer is an etching stop layer. When the lowest layer of the burying layer is composed of a constituent different from the upper layer, the lowest layer functions as a stopping layer for etching. As a result, the inversely trapezoidal burying layer can be effectively formed by means of wet etching.

In addition, as an implementation mode, a resin layer is formed in the groove that electrically isolates the burying layer. Thereby, a wiring that connects an electrode and a bonding pad can be easily formed.

In addition, as an implementation mode, resin that composes the resin layer may be benzocyclobutene resin. Thereby, an optical semiconductor device with a higher reliability than the prior art can be accomplished.

In addition, as an implementation mode, the upper surface of the resin layer is disposed at a lower position than the upper surface of the burying layers. Thereby, a floating wiring is disposed over the groove.

In addition, as an implementation mode, a no substance is filled in the groove. As a result, a floating wiring is disposed over the groove. According to the embodiment, the concentration of a thermal stress to the active layer can be suppressed or reduced. Additionally, the parasitic capacitance of the wiring portion can be reduced.

According to another embodiment of the present invention, resin filled in a groove that electrically isolates a current confinement layer is selectively etched out, and all or part the resin is removed. Since a space portion is formed at a lower portion of a wiring portion disposed over the groove, a thermal stress is suppressed from being allied to the active layer. As a result, a high reliability is obtained. In addition, since the dielectric constant of the space portion is 1 (one) that is lower than that of the resin, the parasitic capacitance of the wiring portion is reduced.

In addition, according to another embodiment of the present invention, part or all of a resin layer formed around a mesa shaped current confinement layer is etched out. Accordingly, since a space portion is formed at a lower portion of a wiring portion, a thermal stress is suppressed from being applied to the active layer. As a result, a high reliability is obtained. In addition, the parasitic capacitance of the wiring portion is reduced.

In the following, an optical semiconductor device according to embodiments of the present invention and a fabricating method thereof will be explained with reference to the drawings.

FIG. 1 is a perspective view showing a configuration of a semiconductor laser according to a first embodiment of the present invention. In FIG. 1, reference numeral 1 represents an n-type InP substrate. An n-type InP buffer layer 2 is formed on the n-type InP substrate 1. A mesa shaped stripe portion ST is formed on the n-type InP buffer layer 2. The mesa shaped stripe portion ST has a laminated structure of which an InGaAsP-MQW active layer 3, a p-type InGaAsP guide layer 4, and a p-type InP layer 5 are successively formed.

Burying layer GM is formed around the stripe portion ST. The burying layer GM has an inversely trapezoidal section of which the upper base side is longer than the lower base side. The stripe portion ST is buried in the burying layer GM. Grooves 6 are formed on both sides of the burying layer GM. The groove 6 isolates adjacent burying layers GM. The depth of the groove 6 is for example 6 μm.

The burying layer GM has a p-type InP burying layer 7 and an n-type InP burying layer 8 that is disposed on the p-type InP burying layer 7. A p-type InP cladding layer 9 and a p-type InGaAs contact layer 10 are successively grown on the n-type InP burying layer 8. On the lowest layer of the burying layers GM, a stopping layer 11 for etching (a etching stop layer 11) is formed. The etching stop layer 11 is composed of p-type InGaAsP. The width of the upper portion of the inverse trapezoid (namely, the width of the upper portion of the burying layer GM) is for example around 12 μm. The width of the lower portion (mesa neck width) is for example 4 μm.

A SiO$_2$ film 12 is formed in the groove 6 that electrically isolates the burying layers GM. Resin 13 is filled in the groove 6. In addition, a p-side electrode 14 is formed on the p-type InGaAs contact layer 10 disposed on an upper portion of the burying layer GM. A bonding pad 15 is formed on the p-side electrode 14 and the resin 13 layer. Further, an n-side electrode 16 is formed on the rear surface of the n-type InP substrate 1.

According to the first embodiment of the present invention, the burying layer GM has an inversely trapezoidal section. Thus, the area of the surface of the junction of the p-type InP burying layer 7 and the n-type InP burying layer 8 that compose the burying layers GM is smaller than that of the prior art. Consequently, the parasitic capacitance caused by the junction can be reduced. As a result, the device capacitance of around 3 pF or lower can be accomplished with high reproducibility.

In addition, since the resin 13 is filled in the groove 6 formed on the both sides of the burying layer GM, the bonding pad 15 that is connected to the p-side electrode 14 can be easily formed on the resin layer 13. Thus, a wiring can be easily formed.

Since the InGaAsP layer (the etching stop layer 11) whose etching speed is very slow in comparison with the p-type InP burying layer 7 and the n-type InP burying layer 8 is disposed on a bottom face of the groove 6, when the groove 6 is formed and the burying layer GM is formed in an inversely trapezoidal shape by means of wet etching and so on, the etching process can be automatically stopped just above the etching stop layer 11. Thus, the etching process can be easily controlled.

In the case that an etching solution that has a selectivity against the orientation of a crystal plane is used, when the (111)A plane of the burying layer GM is exposed, the etching process can be automatically stopped. As a result, the reproducibility of the mesa neck width can be improved.

Next, with reference to the accompanying drawings, a method for fabricating the semiconductor laser according to the first embodiment of the present invention will be explained.

Figure 2:
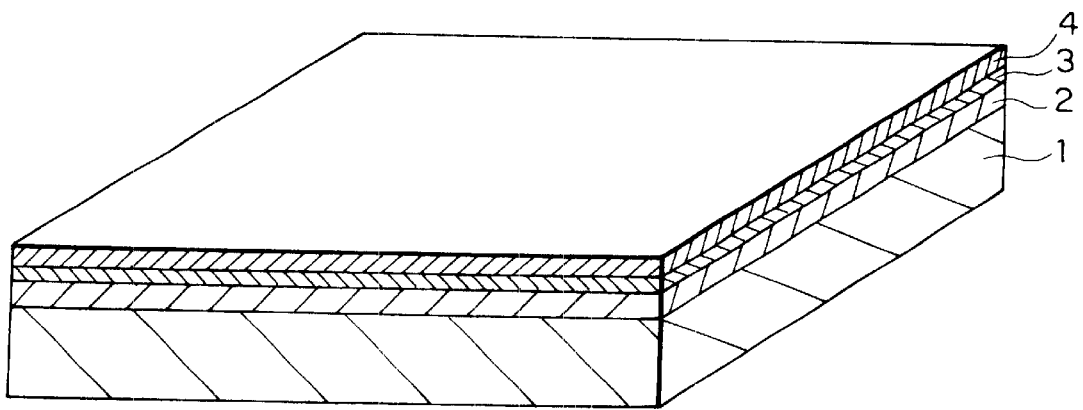
FIG. 2 is a perspective view showing a fabricating process of the semiconductor laser according to the first embodiment of the present invention.
Figure 3:
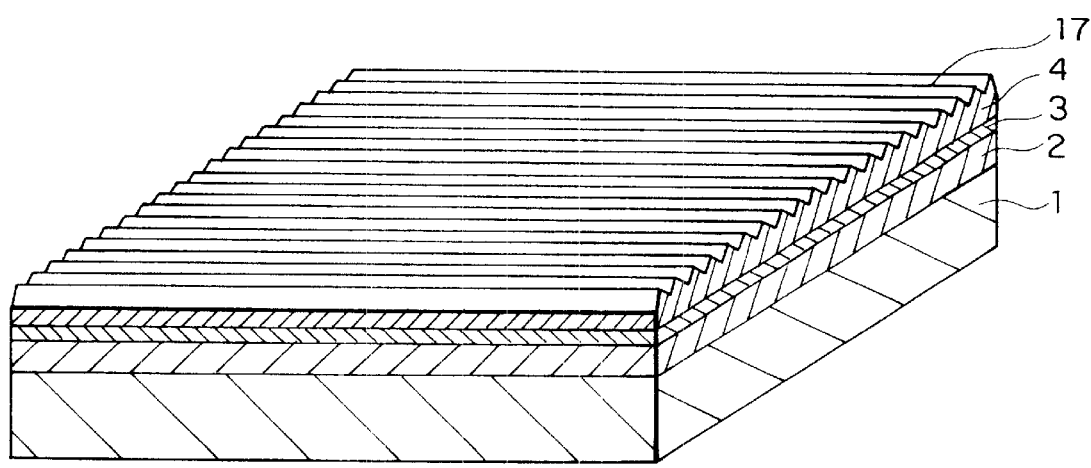
FIG. 3 is a perspective view showing a fabricating process of the semiconductor laser according to the first embodiment of the present invention.
Figure 4:
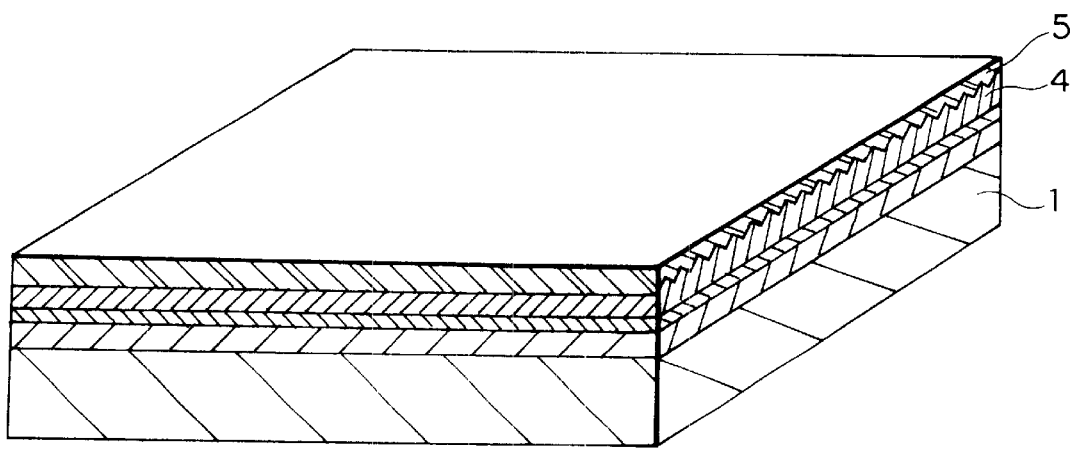
FIG. 4 is a perspective view showing a fabricating process of the semiconductor laser according to the first embodiment of the present invention.

First, as shown in FIG. 2, the n-type InP buffer layer 2, the InGaAsP-MQW active layer 3, and the p-type InGaAsP guide layer 4 are successively epitaxially crystal-grown on the n-type InP substrate 1 whose main plane is plane orientation (100). These may be deposited by means of, for instance, MOCVD (metal-organic chemical vapor deposition), MBE (molecular beam epitaxy), ALE (atomic layer epitaxy) and so on. Thereafter, as shown in FIG. 3, a diffraction grading 17 is formed on the p-type InGaAsP guide layer 4. Next, as shown in FIG. 4, the p-type InP layer 5 is crystal-grown on the diffraction grading 17.

Figure 5:
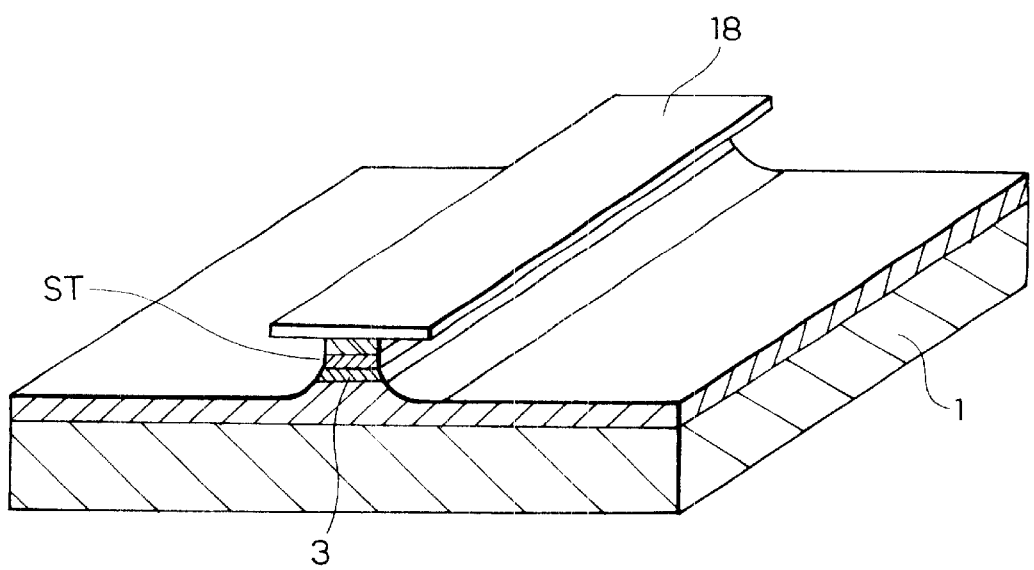
FIG. 5 is a perspective view showing a fabricating process of the semiconductor laser according to the first embodiment of the present invention.

Next, a $SiO_2$ film is deposited on the entire surface of the p-type InP layer 5 by means of CVD. Thereafter, as shown in FIG. 5, the $SiO_2$ film is patterned in a stripe by means of photolithography and etching. As a result, a $SiO_2$ film pattern 18 is formed. The width of the $SiO_2$ film pattern 18 is for example 3 $\mu$m. With the $SiO_2$ film pattern 18 as a mask, the wet etching process is performed. As a result, a mesa shaped stripe portion ST is formed.

Figure 6:
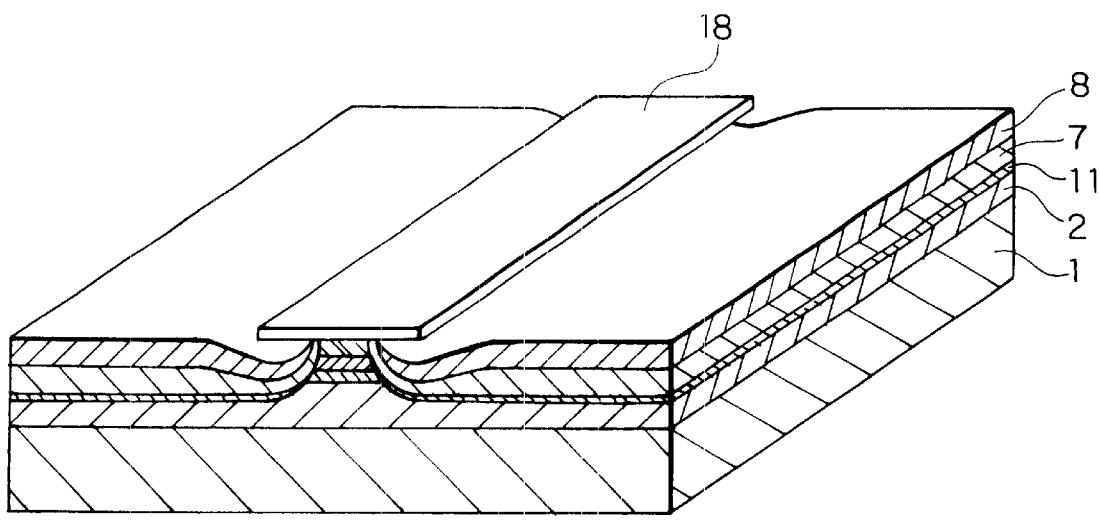
FIG. 6 is a perspective view showing a fabricating process of the semiconductor laser according to the first embodiment of the present invention.

As shown in FIG. 6, with the $SiO_2$ film pattern 18 as a mask, a stopping layer for etching 11 composed of p-type InGaAsP, a p-type InP burying layer 7, and an n-type InP burying layer 8 are successively formed on the n-type InP buffer layer 2 by means of MOCVD. Since crystals are not grown on the $SiO_2$ film, the etching stop layer 11, the p-type InP burying layer 7, and the n-type InP burying layer 8 are selectively grown on both sides of the stripe portion ST. In this example, the carrier concentrations of the p-type InP burying layer 7 is $1\times10^{18}$ cm$^{-3}$ and that of the n-type InP burying layer 8 is $1\times10^{18}$ cm$^{-3}$.

Figure 7:
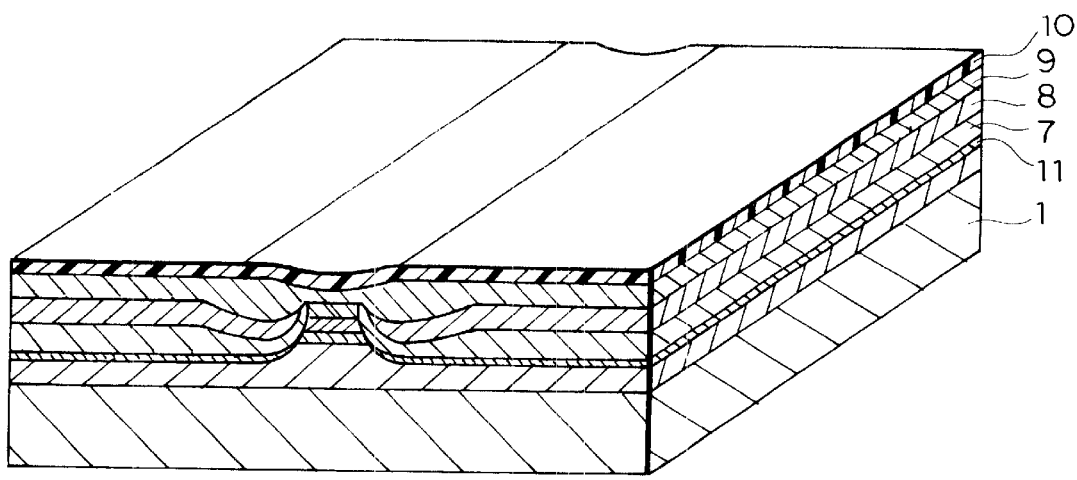
FIG. 7 is a perspective view showing a fabricating process of the semiconductor laser according to the first embodiment of the present invention.
Figure 8:
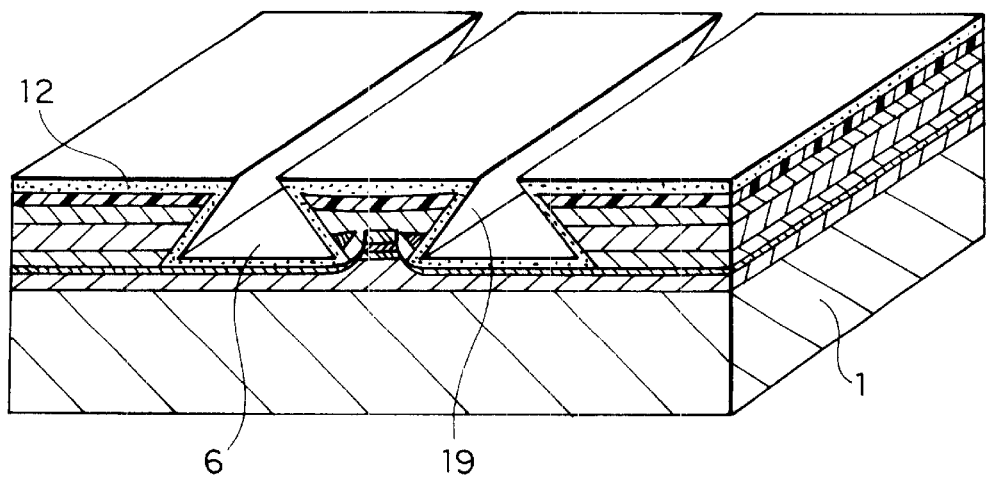
FIG. 8 is a perspective view showing a fabricating process of the semiconductor laser according to the first embodiment of the present invention.

After the $SiO_2$ film pattern 18 is removed, as shown in FIG. 7, a p-type InP cladding layer 9 and a p-type InGaAs contact layer 10 are successively epitaxially crystal-grown on an entire surface. Thereafter, as shown in FIG. 8, the p-type InP burying layer 7, the n-type InP burying layer 8, the p-type InP cladding layer 9, and the p-type InGaAs contact layer 10 are etched out corresponding to the groove 6 by means of wet etching. The burying layers around the active layer (mesa shaped stripe portion ST) are formed in such a manner that their section has an inversely trapezoidal shape.

The groove 6 is wet etched as follows. First of all, the p-type InGaAs contact layer 10 is etched out by using a mixed solution of sulfuric acid and hydrogen peroxide solution. Thereafter, the InP burying layers are etched out with an etching solution of a mixed solution of hydrobromic acid and phosphoric acid so that the crystal plane of a side plane 19 becomes (111)A. Since the etching solution does not etch InGaAsP, the etching process stops just above the etching stop layer 11 composed of p-type InGaAsP. As a result, a structure of which the depth of the groove 6 is for example 6 $\mu$m, the width of the upper portion of the inverse trapezoid of the burying layer GM is for example 12 $\mu$m, and the width of the lower portion (mesa neck width) is 4 $\mu$m can be accomplished.

Next, as shown in FIG. 8, a $SiO_2$ film 12 is deposited on the entire surface by means of CVD. Thereafter, as shown in FIG. 1, resin 13 is filled in the groove 6. The resin 13 is heated at a temperature in the range from 250 to 350° C. and cured (cross linked). Thereafter, a p-side electrode 14 and a bonding pad 15 are formed at the top portion of the burying layer GM by means of evaporation, for example. Thereafter, the rear surface of the n-type InP substrate (wafer) 1 is ground to the thickness of 100 $\mu$m. An n-side electrode 16 is formed on the ground rear surface of the n-type InP substrate 1. Thereafter, the n-side electrode 16 and the p-side electrode 14 are sintered so that they are alloyed. Finally, a device having a size of 300 $\mu$m long and 300 $\mu$m wide is sliced from the wafer. As a result, a semiconductor laser device is obtained.

In the first embodiment of the present invention, a crystal is grown using the MOCVD method. Alternatively, MBE (Molecular Beam Epitaxial growing) method or ALE (Atomic Layer Epitaxial) method may be used.

Figure 9:
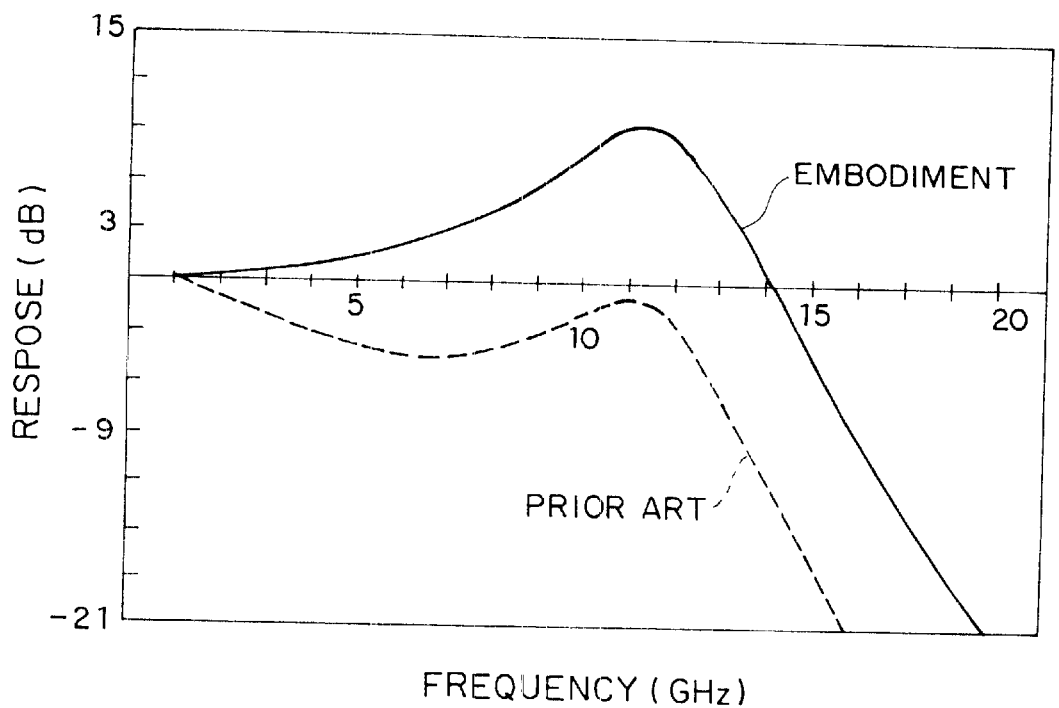
FIG. 9 is a diagram showing a frequency characteristic of the semiconductor laser according to the first embodiment of the present invention.

The capacitance of the semiconductor laser device fabricated in the forgoing manner is 2 pF. The frequency characteristic of the device is as denoted by a solid line of FIG. 9. For comparison, the frequency characteristic of the existing buried hetero semiconductor laser is denoted by a dotted line of FIG. 9.

The device capacitance of the existing buried hetero semiconductor laser is around 6 pF that is not sufficiently low. Thus, the existing buried hetero semiconductor laser has a large roll-off phenomenon. As the frequency becomes higher, a band improvement due to a relaxation oscillation takes place. However, the −3 dB cut-off frequency of the existing buried hetero semiconductor laser is 4 GHz. In contrast, the device capacitance of the semiconductor laser according to the first embodiment is as low as 2 pF and does not have such a roll-off phenomenon. In addition, the −3 dB cut-off frequency of the semiconductor laser according to the first embodiment was as high as 15 GHz. Thus, it is clear that the semiconductor laser according to the first embodiment has a sufficient characteristic as a light source for a direct modulation at 10 Gb/s.

In addition, since the width of the p-n junction portion of the burying layers (mesa width) can be easily reduced, the device capacitance can be reduced without need to decrease the carrier concentrations of the burying layers. In the semiconductor laser according to the first embodiment, since the carrier concentrations of the burying layers are $1\times10^{18}$ cm$^{-3}$, unlike with the case that the carrier concentrations are low, the threshold current does not be increased. In addition, the linearity of current—optical output (I-L) characteristic does not deteriorate.

Figure 10:
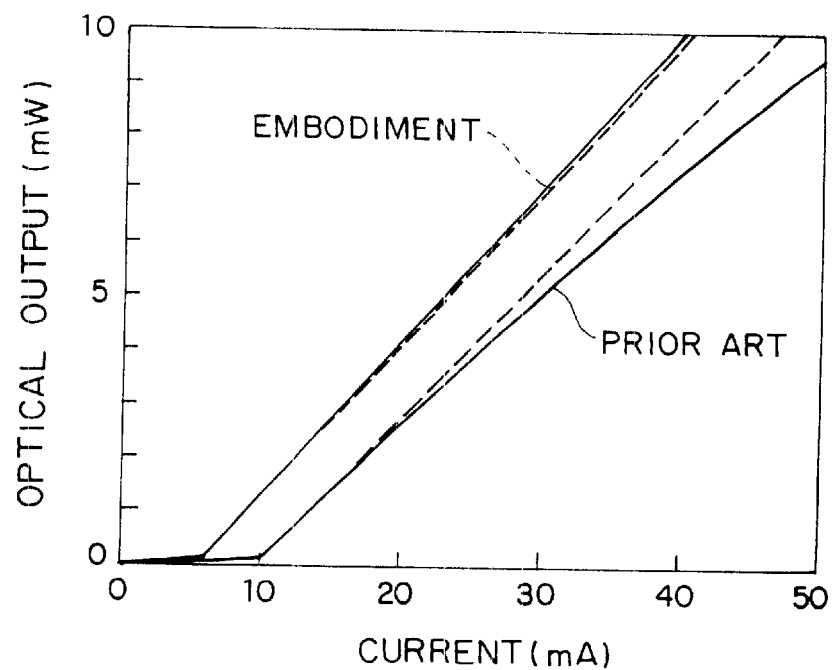
FIG. 10 is a diagram showing the comparison between I-L characteristics of the semiconductor laser according to the first embodiment and I-L characteristics of an existing semiconductor laser having a low carrier concentration.

FIG. 10 is a diagram showing the I-L characteristic of the semiconductor laser according to the first embodiment of the present invention and the I-L characteristic of the existing semiconductor laser with low carrier concentrations ($1 \times 10^{17}$ $cm^{-3}$). In FIG. 10, dotted lines are straight lines that represent linearity.

The threshold current of the semiconductor laser according to the first embodiment of the present invention is 6 mA. The threshold current can be remarkably reduced in comparison with that of the existing semiconductor laser whose carrier concentration is low (9 mA). The I-L characteristic of the semiconductor laser according to the first embodiment almost represents a straight line. In contrast, the I-L characteristic of the existing buried hetero semiconductor laser whose carrier concentration is low largely deviates from the straight line. Thus, according to the first embodiment of the present invention, the linearity of the I-L characteristic can be improved.

Figure 11:
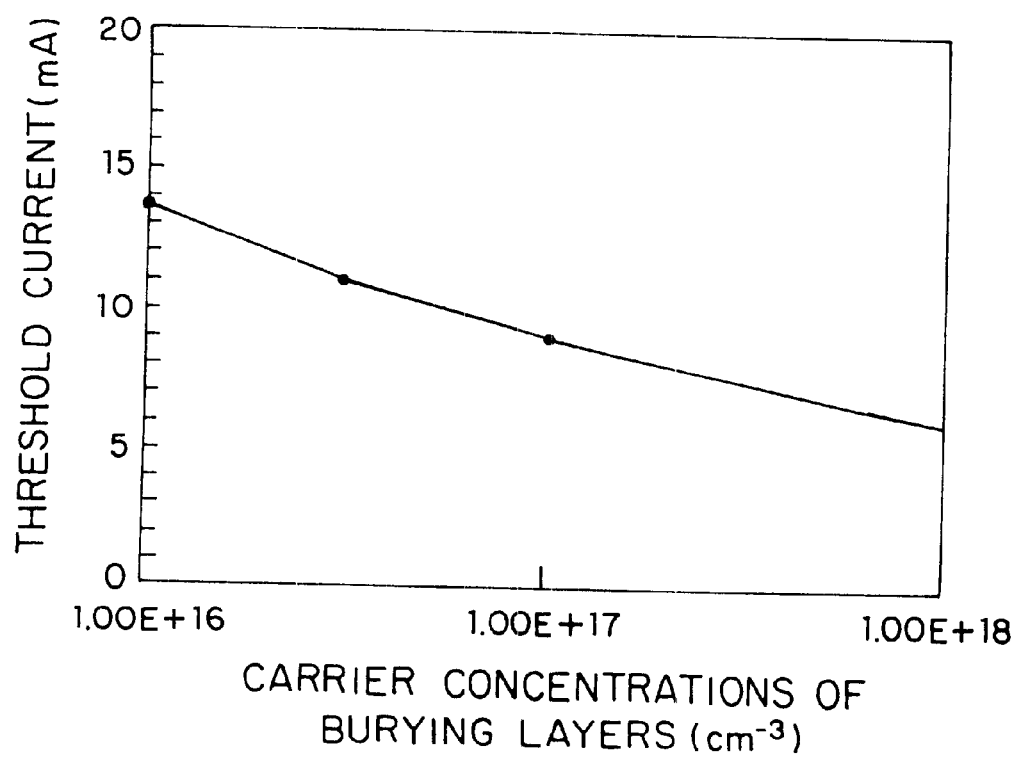
FIG. 11 is a diagram showing the relation between a carrier concentration of an n-type InP burying layer and a threshold current of the semiconductor laser according to the first embodiment of the present invention.

FIG. 11 is a diagram showing the relation between a carrier concentration of an n-type InP burying layer and a threshold current. In the semiconductor laser according to the first embodiment of the present invention, since the carrier concentrations of the burying layers can be increased to $1 \times 10^{18}$ $cm^{-3}$, a low threshold current can be easily accomplished.

According to the first embodiment, when benzocyclobutene whose hygroscopic property is low is used as a constituent of resin filled in the groove, since the change on standing of the threshold current is small, a higher reliability is obtained.

FIG. 12 is a diagram showing results of reliability tests of which benzocyclobutene resin and polyimide resin were used as resin filled in the groves of the semiconductor laser according to the first embodiment of the present invention. The tests are performed in the same condition of which the ambient temperature was 100° C. and the current value was constant with 200 mA.

Figure 12A:
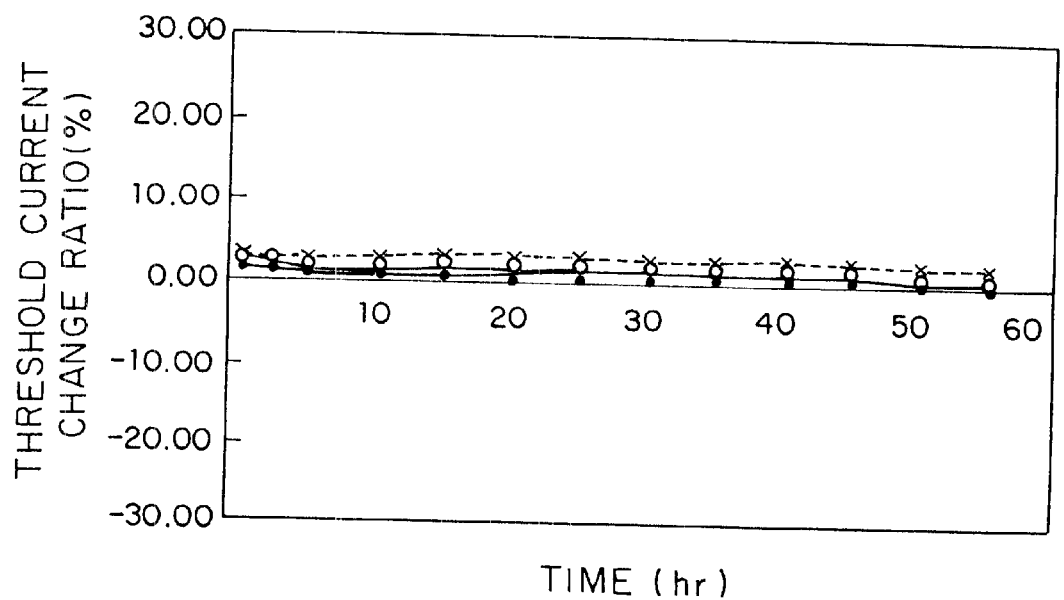
FIG. 12A is a diagram showing a result of a reliability test in the case that the filled resin of the semiconductor laser according to the first embodiment of the present invention is benzocyclobutene resin.
Figure 12B:
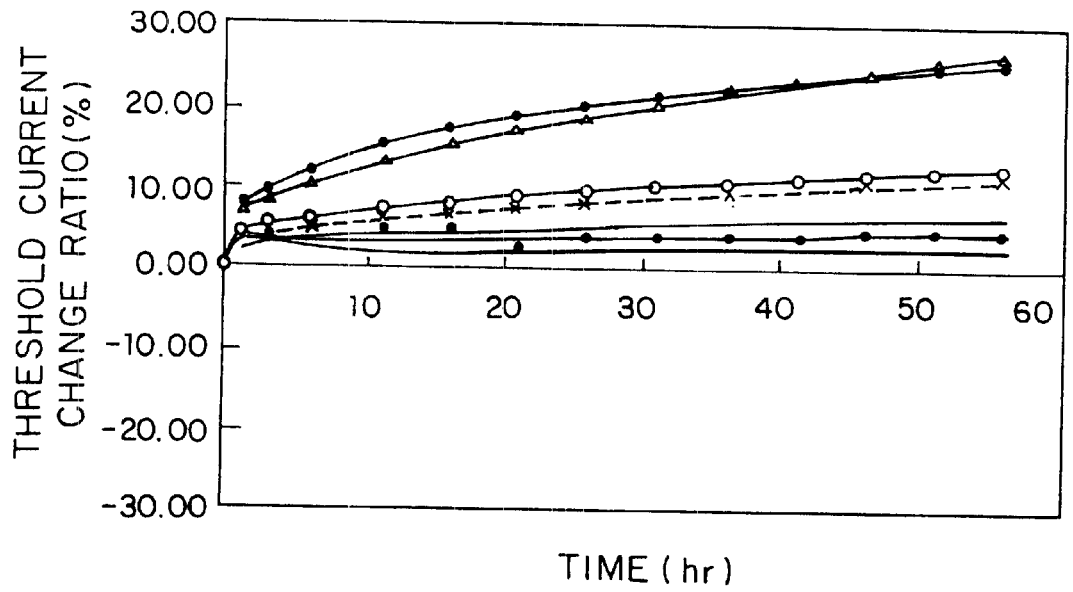
FIG. 12B is a diagram showing a result of a reliability test in the case that the filled resin of the semiconductor laser according to the embodiment of the present invention is polyimide resin.

When the benzocyclobutene resin was used, as shown in FIG. 12A, the chronological change of the threshold current was small. In contrast, when the polyimide resin was used, as shown in FIG. 12B, the chronological change of the threshold current was large. When 50 hours elapsed, the threshold current of the device was increased by 25% or more.

When the benzocyclobutene resin is filled in the groove, a high reliability can be obtained.

In addition, according to the first embodiment of the present invention, after wiring such as bonding pad is formed on the resin layer filled in the groove, part or all the resin is removed and a space portion whose dielectric constance is low is formed below the wiring. As a result, a higher reliability can be obtained.

Figure 13:
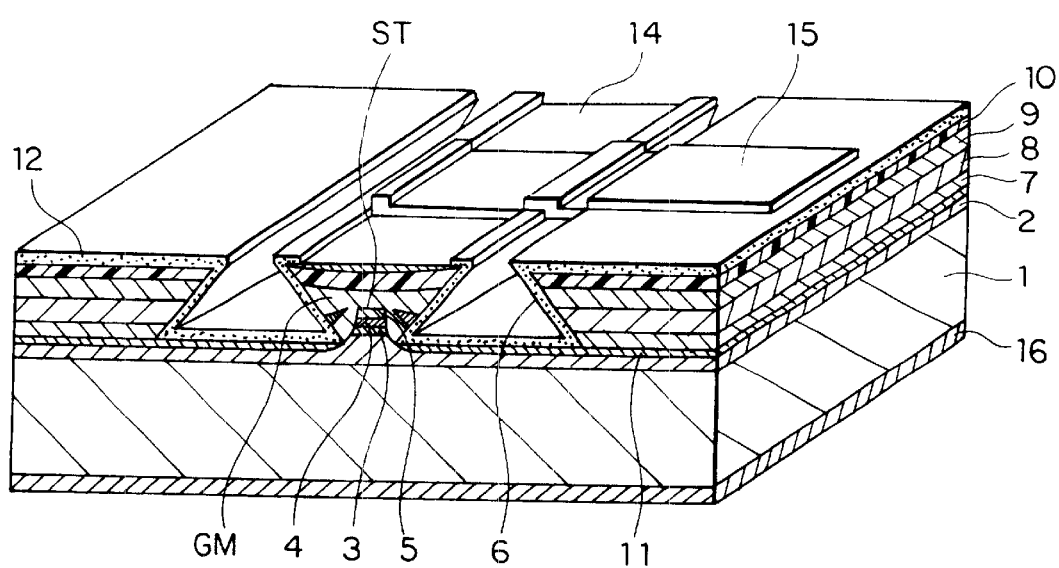
FIG. 13 is a perspective view showing a configuration of a semiconductor laser according to a second embodiment of the present invention.

FIG. 13 is a sectional view showing a configuration of a semiconductor laser according to a second embodiment of the present invention. In the semiconductor laser according to the second embodiment, there is no resin layer in a groove 6 that electrically isolates burying layer GM and a space portion is formed in the groove 6. Wiring such as bonding pad 15 has a floating structure over the groove 6. Since the other portions of the semiconductor laser according to the second embodiment are the same as those of the first embodiment, their description will be omitted.

According to the second embodiment, a floating wiring portion is formed as follows.

First of all, resin is filled in the groove 6. The resin is heated at a temperature in the range from 250 to 350° C. and cured. Thereafter, a p-side electrode 14 is formed at the top portion of the burying layers GM that have an inverse trapezoidal shape by means of evaporation, for example. A bonding pad 15 is formed on the p-side electrode 14 and the resin layer. Thereafter, all the resin filled in the groove 6 is removed by means of dry etching. For example, when the resin is etched with a mixed gas of $CF_4$ and $O_2$, only the resin filled in the groove 6 can be selectively removed. After, the rear surface of the n-type InP substrate (wafer) 1 is ground. An n-side electrode 16 is formed on the ground rear surface of the n-type InP substrate 1.

After all the resin filled in the groove 6 is etched out, the sintering process is performed. Thus, a thermal stress is suppressed from being applied to the active layer 3. As a result, a high reliability is obtained. In other words, the heating temperature of the sintering process (alloying process) is normally higher than the curing temperature of the resin. Thus, when the resin is filled in the groove 6, a stress caused due to the difference of thermal expansion coefficients of the semiconductor and the resin may concentrate on the active layer. Thus, the reliability may deteriorate. However, when the resin filled in the groove 6 is etched out, the concentration of the stress to the active layer can be alleviated. Accordingly, the reliability is improved.

In addition, according to the second embodiment of the present invention, wiring such as bonding pad 15 is formed over the groove 6. Thus, a space portion is formed below the wiring. The dielectric constant of the space portion is 1 that is lower than that of the resin. Consequently, the parasitic capacitance of the wiring portion can be reduced.

Although all the resin filled in the groove 6 can be removed, part thereof may be removed so that the resin layer resides at the lower portion of the groove 6. In such a structure, the concentration of the stress to the active layer 3 can be suppressed or reduced and the parasitic capacitance of the wiring portion can be reduced.

The floating structure of the wiring portion may be applied to the ridge waveguide semiconductor laser.

Figure 14:
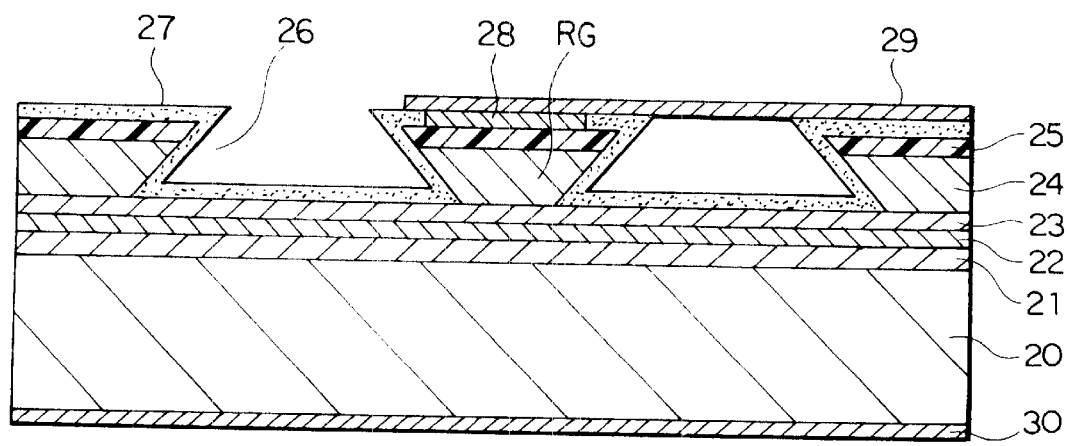
FIG. 14 is a sectional view showing a configuration of a semiconductor laser according to a third embodiment of the present invention.

FIG. 14 is a sectional view showing a configuration of a ridge waveguide semiconductor laser according to a third embodiment of the present invention. In the semiconductor laser according to the third embodiment, an n-type InGaAsP cladding layer 21, a JnGaAsP-MQW active layer 22, and a p-type JnGaAsP cladding layer 23 are successively formed on an n-type InP substrate 20. A ridge-stripe shaped p-type InP cladding layer 24 is formed on the p-type JnGaAsP cladding layer 23. A p-type InGaAs contact layer 25 is formed on the ridge-stripe shaped p-type InP cladding layer 24. Grooves 26 that electrically isolate ridge portions RG are formed on both sides of the ridge portion RG of the p-type InP cladding layer 24. The ridge portion RG of the p-type InP cladding layer 24 functions as a current confinement layer. The ridge portion RG confines a current injected and supplied from a p-side electrode (that will be described later) and causes the current to flow in the active layer 22. In the p-type InP cladding layer 24, the width of the stripe shaped portion adjacent to the active layer 22 is 2.5 μm.

In addition, an $SiO_2$ film 27 is formed in the groove 26. A p-side electrode 28 is formed on a p-type InGaAs contact layer 25 and a wiring portion 29 such as bonding pad connected to the p-side electrode 28 is formed over the groove 26. Resin is not filled in the groove 26 and a space portion is formed therein. The wiring portion 29 such as bonding pad is formed in a floating structure. In addition, an n-side electrode 30 is formed on the rear surface of the n-type InP substrate 20.

The wiring portion in the floating structure according to the third embodiment is formed in the same manner as the second embodiment.

In other words, the p-type InP cladding layer 24 and the p-type InGaAs contact layer 25 corresponding to the groove 26 are etched out. After the ridge portion RG as a current confinement layer is formed, the SiO$_2$ film 27 is deposited on the entire surface by means of CVD. Next, resin is filled in the groove 26. The resin is heated at a temperature in the range from 250 to 350° C. and cured. Thereafter, the p-side electrode 28 is formed on the p-type InGaAs contact layer 25 of the ridge portion RG by means of evaporation, for example. In addition, the wiring portion 29 such as bonding pad is formed on the p-side electrode 28 and the resin layer in the groove 26. Thereafter, all the resin filled in the groove 26 is removed by means of dry etching. After the rear surface of the n-type InP substrate (wafer) 20 is ground and the n-side electrode 30 is formed on the rear surface of the ground rear surface of the n-type InP substrate 20. Thereafter, the n-side electrode 30 and the p-side electrode 28 are sintered so that they are alloyed.

According to the third embodiment of the present invention, after all the resin filled in the groove 26 is etched out, the sintering process is performed. Since the thermal stress is suppressed from being applied to the active layer 22, a high reliability is obtained. In addition, the wiring portion 29 such as bonding pad is formed over the groove 26 and a space portion whose dielectric constant is lower than that of the resin is formed below the wiring portion 29. Accordingly, the parasitic capacitance of the wiring portion 29 is reduced.

Although all the resin filled in the groove 26 may be etched out, even if part of the resin remains at the lower portion of the groove 26, the same advantageous effect can be obtained.

Figure 15:
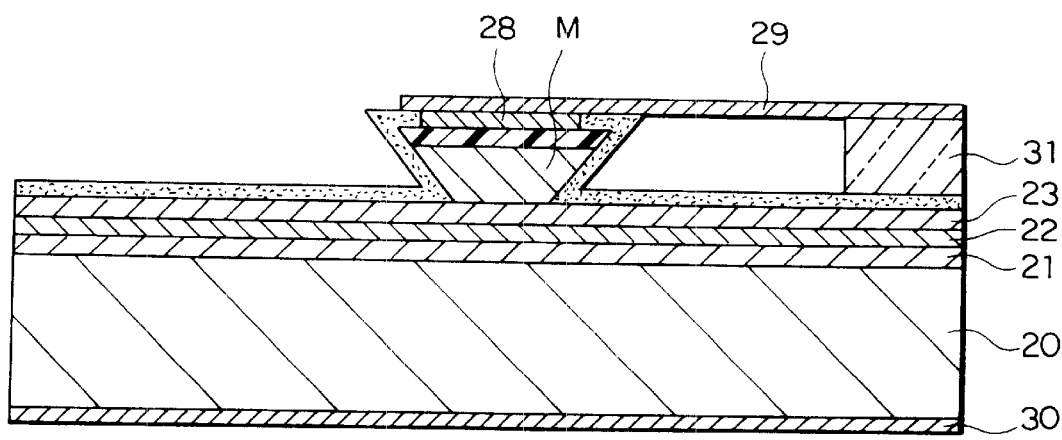
FIG. 15 is a sectional view showing a configuration of an optical semiconductor device according to a fourth embodiment of the present invention.
Figure 16:
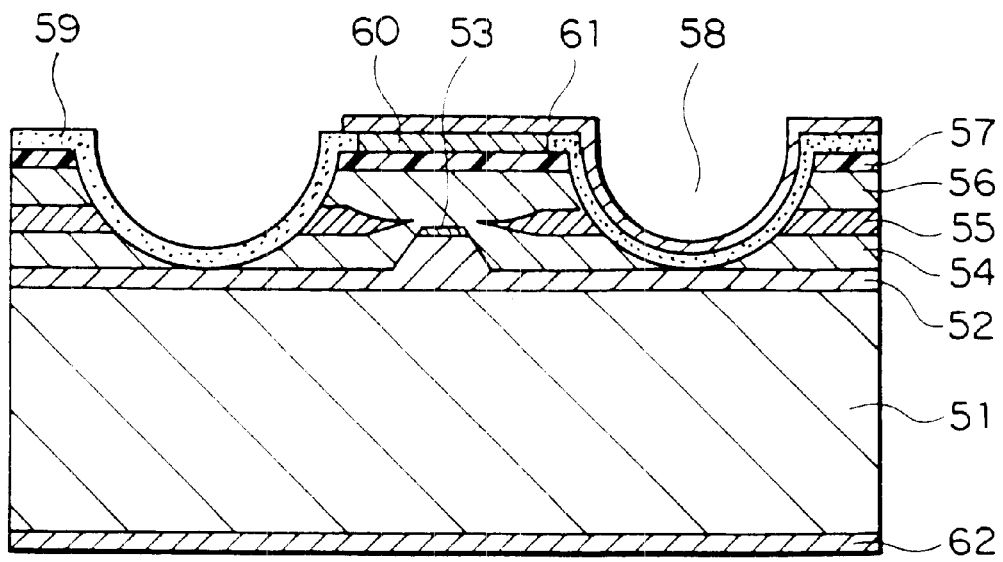
FIG. 16 is a sectional view showing a configuration of an existing buried hetero semiconductor laser.
Figure 17:
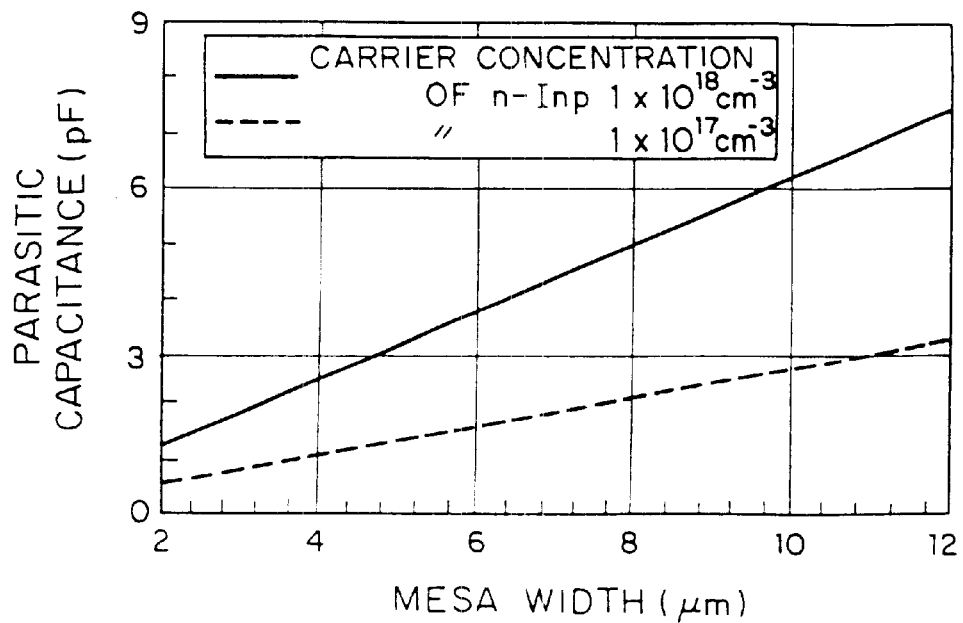
FIG. 17 is a diagram showing the relation between a mesa width of burying layers and a parasitic capacitance of an existing buried hetero semiconductor laser.
Figure 18:
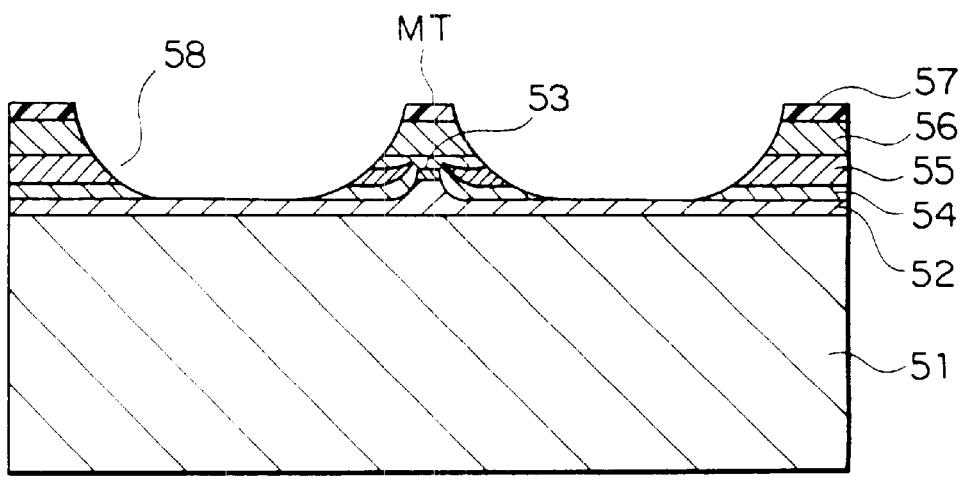
FIG. 18 is a sectional view showing a configuration of another example of an existing buried hetero semiconductor laser.
Figure 19:
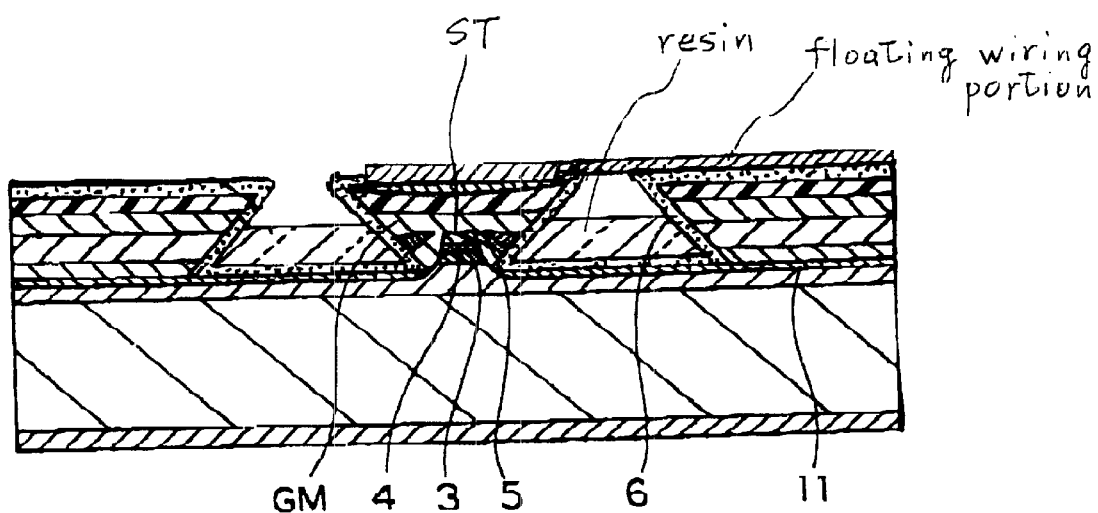
FIG. 19 is a sectional view showing the a configuration of a semiconductor laser with a resin filled groove according to the present invention.

Next, a fourth embodiment of the present invention will be explained. According to the fourth embodiment, as shown in FIG. 15, a current confinement layer that confines a current injected and supplied from a p-side electrode 28 and causes the current to flow in an active layer 22 is formed in a mesa shape. A wiring portion 29 having a floating structure is formed around the mesa shaped current confinement layer M.

The floating wiring structure according to the fourth embodiment can be formed in the same manner as the second and third embodiments. A p-type InP cladding layer 24 and a p-type InGaAs contact layer 25 are etched out so that the mesa shaped current confinement layer M is formed. After a SiO$_2$ film 27 is deposited on the entire surface by means of CVD and resin 31 is filled in a lower portion around the mesa shaped current confinement layer M. Thereafter, the resin 31 is heated and cured.

Next, a p-side electrode 28 is formed. After a wiring portion 29 such as bonding pad is formed on the p-side electrode 28 and the resin layer 31 and with the bonding pad as a mask, the resin 31 is removed by means of dry etching. Thus, the resin 31 resides only below the bonding pad. As a result, the wiring portion 29 in the floating structure is formed. Thereafter, the rear surface of the n-type InP substrate (wafer) 20 is ground. After an n-side electrode 30 is formed on the ground rear surface of the n-type InP substrate 20 and the n-side electrode 30 and the p-side electrode 28 are sintered so that they are alloyed.

In the optical semiconductor device according to the fourth embodiment of the present invention the concentration of the thermal stress to the active layer 22 can be suppressed or reduced. In addition, the parasitic capacitance of the wiring portion 29 is reduced.

In the forgoing embodiments, the case of which InGaAsP/InP materials are used was explained. Alternatively, GaAs/AlGaAs materials and AlGaInP material may be used. In addition, it should be noted that the present invention is not limited to a semiconductor laser. Instead, the present invention can be applied to various types of optical semiconductor devices such as LED (Light Emitting Diode), PD (Photo Diode), optical modulator, and optical semiconductor switch.

Although the present invention has been shown and described with respect to embodiments thereof, it should be understood by those skilled in the art that the foregoing and various other changes, omissions, and additions in the form and detail thereof may be made therein without departing from the spirit and scope of the present invention.

What is claimed is:

1. A buried hetero semiconductor laser, comprising:
   a first conduction type substrate;
   an active layer formed in a stripe over the first conduction type substrate;
   a mesa shaped burying layer formed around the active layer and having a larger band gap than that of the active layer; and
   a groove that electrically isolates the burying layer,
   wherein the section of the burying layer is in an inverse trapezoid shape which has a first base side and a second base side parallel to the first base side, the second base side being closer to the first conduction type substrate than the first base side, and the first base side is longer than the second base side.

2. The buried hetero semiconductor laser as set forth in claim 1,
   wherein the burying layer has a laminated structure of the first conduction type semiconductor layer and a second conduction type semiconductor layer.

3. The buried hetero semiconductor laser as set forth in claim 2,
   wherein the carrier concentrations of the first conduction type semiconductor layer and the second conduction type semiconductor layer are larger than $1 \times 10^{17}$ cm$^{-3}$, respectively.

4. The buried hetero semiconductor laser as set forth in claim 1,
   wherein a stopping layer for etching is disposed on a bottom face of the groove.

5. The buried hetero semiconductor laser as set forth in claim 1, further comprising a resin layer formed in the groove.

6. The buried hetero semiconductor laser as set forth in claim 5,
   wherein the resin includes benzocyclobutene resin.

7. The buried hetero semiconductor laser as set forth in claim 5,
   wherein the upper surface of the resin layer is lower than the upper surface of the burying layer, and
   further comprising a floating wiring portion formed over the groove.

8. The buried hetero semiconductor laser as set forth in claim 1,
   wherein no substance is filled in the groove, and
   further comprising a floating wiring portion formed over the groove.

9. The buried hetero semiconductor laser as set forth in claim 1, wherein the burying layer is formed on a side surface of the active layer and comprises a second conduction type semiconductor layer, the first conduction type semiconductor layer that is laminated on the second conduction type semiconductor layer, and the second conduction type cladding layer disposed on the active layer and the first conduction type semiconductor layer.

10. A buried hetero semiconductor laser, comprising:

a first conduction type substrate;

an active layer formed over the first conduction type substrate;

a current confinement layer formed in a ridge stripe on the active layer;

a groove that electrically isolates the current confinement layer, the groove having a space portion; and a floating wiring portion formed over the groove.

11. A buried hetero semiconductor laser, comprising:

a first conduction type substrate;

an active layer formed on the first conduction type substrate; and a mesa shaped current confinement layer formed on the active layer, wherein a floating wiring portion is formed around the current confinement layer.

* * * * *